US009250995B2

(12) United States Patent
Ellis et al.

(10) Patent No.: US 9,250,995 B2
(45) Date of Patent: Feb. 2, 2016

(54) PROTECTION OF DATA IN MEMORY

(71) Applicant: Seagate Technology LLC, Cupertino, CA (US)

(72) Inventors: Jackson L. Ellis, Fort Collins, CO (US); Earl T. Cohen, Cupertino, CA (US); Sivakumar Sambandan, Pune, IN (US); Jeonghun Kim, Fort Collins, CO (US); Stephen D. Hanna, Fort Collins, CO (US)

(73) Assignee: Seagate Technology LLC, Cupertino, CA (US)

( * ) Notice: Subject to any disclaimer, the term of this patent is extended or adjusted under 35 U.S.C. 154(b) by 278 days.

(21) Appl. No.: 13/911,443

(22) Filed: Jun. 6, 2013

(65) Prior Publication Data

US 2014/0359395 A1 Dec. 4, 2014

Related U.S. Application Data

(60) Provisional application No. 61/828,425, filed on May 29, 2013.

(51) Int. Cl.
*G11C 29/00* (2006.01)
*G06F 11/10* (2006.01)

(52) U.S. Cl.
CPC ........ *G06F 11/1016* (2013.01); *G06F 11/1008* (2013.01); *G06F 11/1044* (2013.01); *G06F 11/1076* (2013.01); *G11C 29/00* (2013.01)

(58) Field of Classification Search
CPC ...... G06F 11/1068; G06F 11/14; G11C 29/00
See application file for complete search history.

(56) References Cited

U.S. PATENT DOCUMENTS

| | | | | |
|---|---|---|---|---|
| 5,940,233 A * | 8/1999 | Malone, Sr. | | 360/51 |
| 6,212,646 B1 * | 4/2001 | Miwa et al. | | 713/601 |
| 6,349,056 B1 * | 2/2002 | Conley et al. | | 365/185.04 |
| 7,076,604 B1 | 7/2006 | Thelin | | 711/112 |
| 7,818,512 B2 * | 10/2010 | Bartley et al. | | 711/148 |
| 8,051,366 B2 | 11/2011 | Maeto | | 714/795 |
| 8,327,220 B2 | 12/2012 | Borchers et al. | | 714/758 |
| 8,417,987 B1 * | 4/2013 | Goel et al. | | 714/6.1 |
| 8,730,721 B2 * | 5/2014 | Camp et al. | | 365/185.02 |
| 2011/0026302 A1 | 2/2011 | Xi et al. | | 365/148 |
| 2013/0024735 A1 | 1/2013 | Chung et al. | | 714/704 |

* cited by examiner

*Primary Examiner* — Esaw Abraham
(74) *Attorney, Agent, or Firm* — Christopher P. Maiorana, PC

(57) ABSTRACT

A method for protecting data in a memory is disclosed. The method generally includes steps (A) to (D). Step (A) converts a logical address of one of a plurality of logical units to a physical address of a corresponding one of a plurality of physical units. Each physical unit is configured to store (i) data from a corresponding one of the logical units, (ii) respective error correction information and (iii) respective verification information. Step (B) writes a particular one of the physical units to the memory. Step (C) reads a portion of the particular physical unit from the memory. The portion includes the respective verification information. The respective verification information includes an indication of the logical address. Step (D) verifies the writing according to the respective verification information in the portion.

20 Claims, 10 Drawing Sheets

PROTECTION OF DATA IN MEMORY

This application relates to U.S. Provisional Application No. 61/828,425, filed May 29, 2013, which is hereby incorporated by reference in its entirety.

FIELD OF THE INVENTION

The invention relates to memory management generally and, more particularly, to a method and/or apparatus for implementing protection of data in memory.

BACKGROUND

Conventional implementations of memory controllers often fail to pass robust electrostatic discharge, clock jitter and power margin testing because of undetected corruption of data in an external memory device. The corruption occurs due to interface events and internal memory device events. The interface events, such as the electrostatic discharge, occur on wires connecting the memory controllers and the external memory devices and can corrupt the data and addresses being transferred on the wires. The internal events include soft errors within the external memory device, such as ionizing radiation that can flip bits within memory cells.

SUMMARY

The invention concerns a method for protecting data in a memory. The method generally includes steps (A) to (D). Step (A) converts a logical address of one of a plurality of logical units to a physical address of a corresponding one of a plurality of physical units. Each physical unit is configured to store (i) data from a corresponding one of the logical units, (ii) respective error correction information and (iii) respective verification information. Step (B) writes a particular one of the physical units to the memory. Step (C) reads a portion of the particular physical unit from the memory. The portion includes the respective verification information. The respective verification information includes an indication of the logical address. Step (D) verifies the writing according to the respective verification information in the portion.

BRIEF DESCRIPTION OF THE FIGURES

Embodiments of the invention will be apparent from the following detailed description and the appended claims and drawings in which:

DETAILED DESCRIPTION OF THE PREFERRED EMBODIMENTS

Embodiments of the invention include providing protection of data in memory that may (i) write verify just-written data, (ii) read retry where read data cannot be properly decoded, (iii) protect the data in the presence of electrostatic discharge events, (iv) protect the data in the presence of power margin events, (v) protect the data in the presence of clock jitter, (vi) be implemented as an integrated circuit and/or (vii) be implemented in a solid-state-drive.

Some embodiments of the present invention provide a write with verify, a read retry and a single event upset detection/correction method and/or circuitry that protects and makes available data stored externally in a memory. Examples of the memory include, but are not limited to, a double data rate memory. The methods and/or circuitry are designed to survive robust electrostatic discharge, power margin, and/or clock jitter testing challenges targeted at a memory controller and protect the data being stored in the external memory. The memory controller is often implemented as a solid-state drive controller. The external memory is usually implemented as part of the solid-state drive and external to the memory controller.

Error correction coding and cyclical redundancy check coding are provided for the data protection. Addresses presented to the external memory are encoded in each multibyte (e.g., 56 byte or 60 byte) logical unit of data being stored. The data and the error correction coding/cyclical redundancy check protection bytes together add up to a fixed size (e.g., 64 byte) physical unit, referred to as a quantum burst (e.g., QB) of data. Each quantum burst (or physical unit) can be efficiently written to and read from the external memory device. In addition, a write with verify feature and a read retry feature provide detection and survival of an electrostatic discharge shock event, a power droop event and/or an errant clock edge event. Each quantum burst written to the external memory can be fully or partially verified and any quantum burst that is corrupted can be read again on-the-fly without processor intervention.

Figure 1:
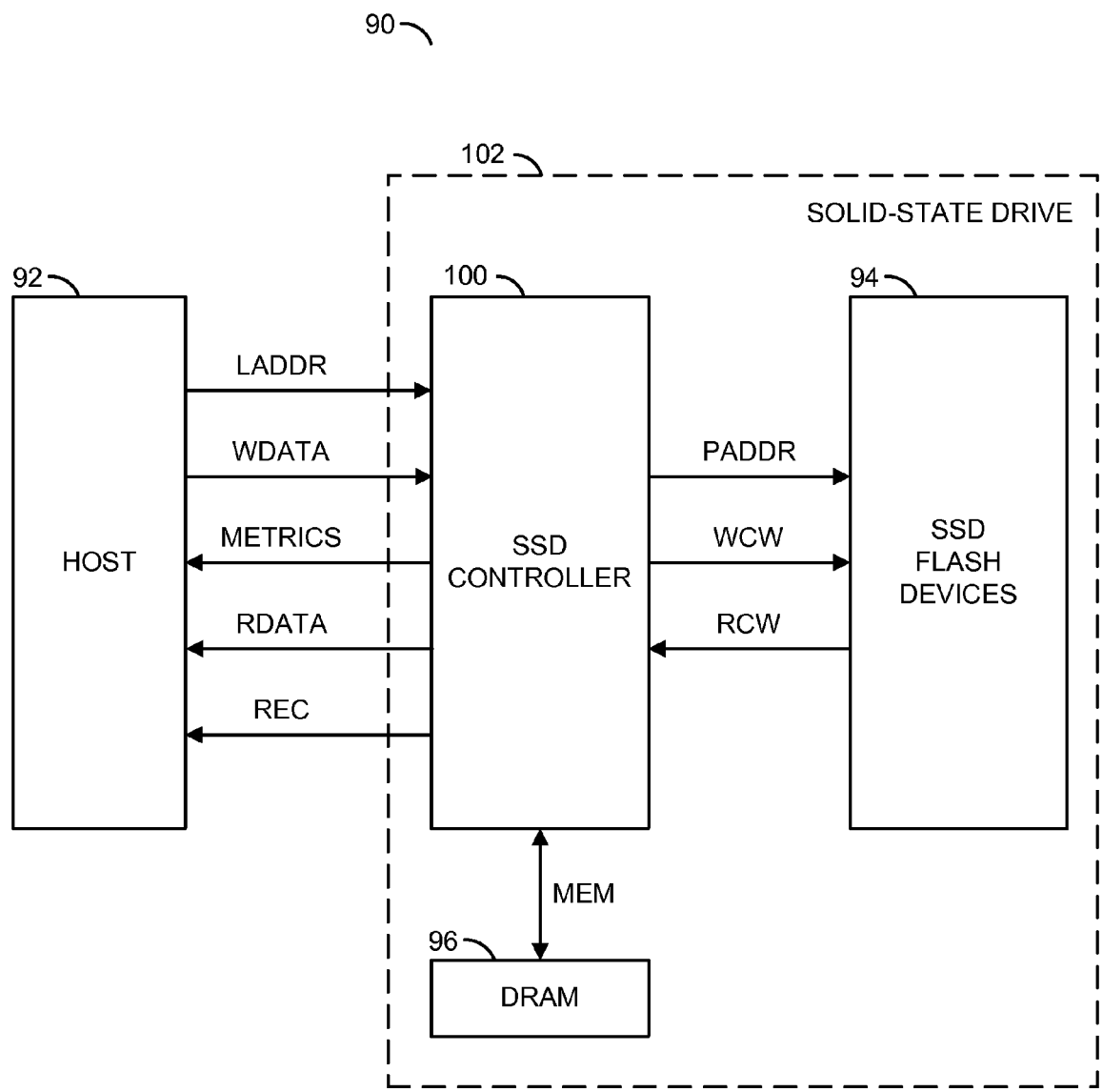
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94, a block (or circuit) 96 and a block (or circuit) 100. The circuits 94, 96 and 100 form a drive (or device) 102. The circuits 92 to 102 may represent modules and/or blocks that may be implemented as hardware, software, a combination of hardware and software, or other implementations.

A signal (e.g., LADDR) is generated by the circuit 92 and received by the circuit 100. The signal LADDR implements an address signal used to access data. The signal LADDR is shown as a logical address. A signal (e.g., PADDR) is generated by the circuit 100 and received by the circuit 94. The signal PADDR implements an address signal used to access data in the circuit 94. The signal PADDR is shown as a physical address. A signal WDATA is shown generated by the circuit 92 and presented to the circuit 100. The signal WDATA conveys write data transferred to the circuit 100. A signal (e.g., WCW) is shown generated by the circuit 100 and transferred to the circuit 94. The signal WCW carries error correction coded and cyclical redundancy check protected write codewords written into the circuit 94. A signal (e.g., ROW) is shown generated by the circuit 94 and received by the circuit 100. The signal RCW carries error correction coded codewords read from the circuit 94. A signal (e.g., RDATA) is shown generated by the circuit 100 and presented to the circuit 92. The signal RDATA carries error corrected versions of the data in the signal RCW. A signal (e.g., MEM) is shown in communication between the circuit 100 and the circuit 96. The signal MEM conveys physical address and command information used in reading and writing data to/from the circuit 96. The signal MEM also conveys data being written to and read from the circuit 96. A signal (e.g., METRICS) is optionally generated by the circuit 100 and transferred to the circuit 92. The signal METRICS carries service metrics gathered for reads/writes to the circuit 96. A signal (e.g., REC) is optionally transferred from the circuit 100 to the circuit 92. Assertion of the signal REC requests that the circuit 92 perform a recovery operation.

The circuit 92 is shown implemented as a host circuit. The circuit 92 is generally operational to read and write data to and from the circuit 94 via the circuit 100. When reading or writing data, the circuit 92 may place an address value in the signal LADDR to identify which set of data is to be written or to be read from the circuit 94. The write data may be presented in the signal WDATA. The read data requested by the circuit 92 may be received via the signal RDATA. The signal LADDR generally spans a logical address range of the circuit 102. The signal LADDR can address individual data units, such as SATA (e.g., serial-ATA) sectors.

The circuit 94 is shown implementing one or more nonvolatile memory circuits (or devices). According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., physical address) in the signal PADDR. The signal PADDR generally spans a physical address range of the circuit 94.

The circuit 96 is shown implemented as a dynamic random access memory (e.g., DRAM). In some embodiments, the circuit 96 is implemented as a double data rate memory. In other embodiments, the circuit 96 is implemented as a static random access memory. The circuit 96 may be a volatile memory or a nonvolatile memory. Other memory technologies may be implemented to meet the criteria of a particular application.

The circuit 100 is shown implemented as a controller circuit. The circuit 100 is generally operational to control reading to and writing from the circuit 94. The circuit 100 is also operational to control reading to and writing from the circuit 96. The circuit 100 comprises one or more integrated circuits (or chips or die) implementing the controller of one or more solid-state drives (e.g., SSD), embedded storage, or other suitable control applications.

Figure 2:
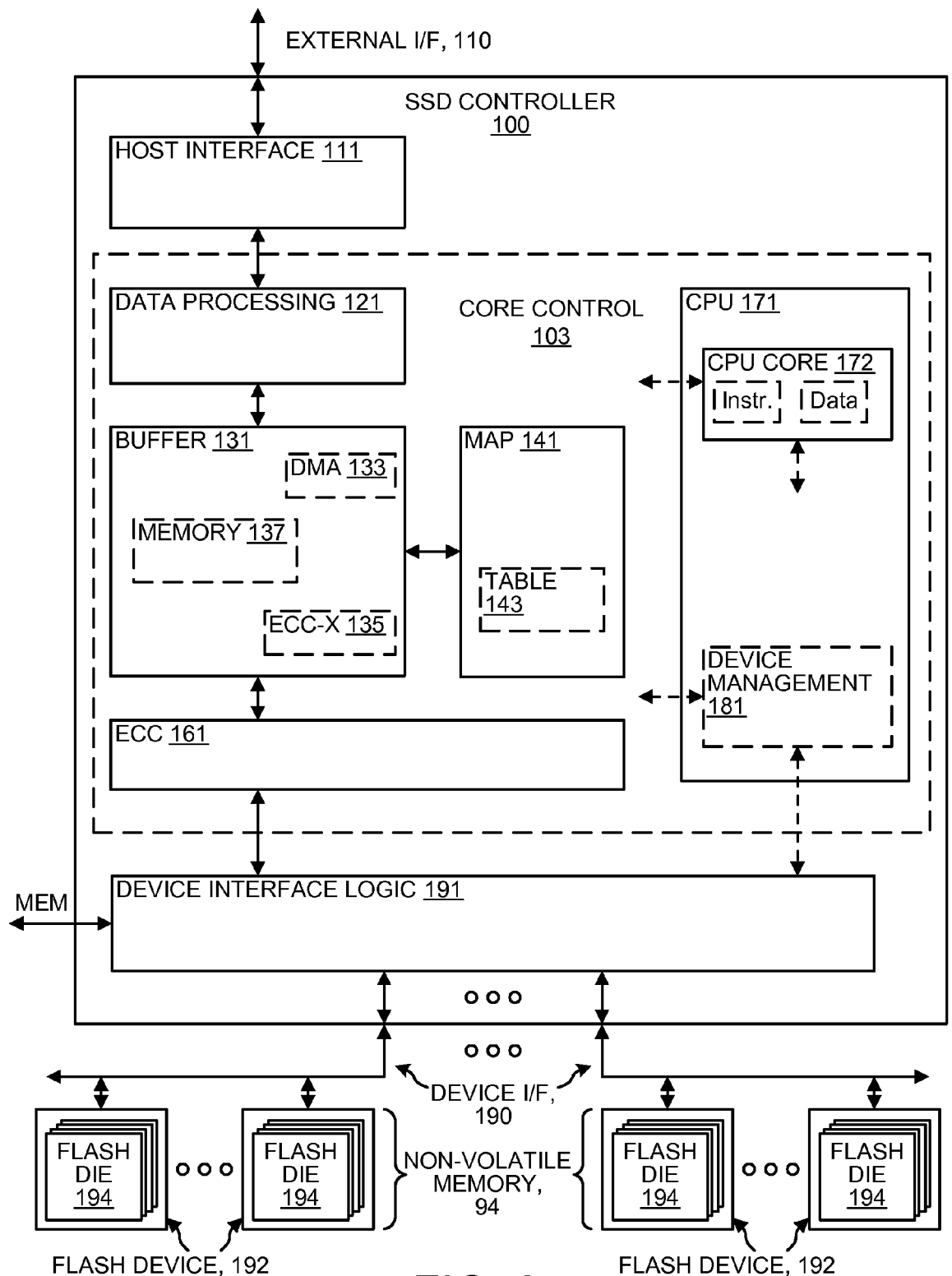
FIG. 2 is a block diagram of a controller.

Referring to FIG. 2, a diagram illustrating an example implementation of the circuit 100 is shown. The circuit 100 generally comprises a block (or circuit) 103, a block (or circuit) 111 and a block (or circuit) 191. The circuit 103 generally comprises a block (or circuit) 121, a block (or circuit) 131, a block (or circuit) 141, a block (or circuit) 161 and a block (or circuit) 171. The circuits 103 to 191 may represent modules and/or blocks that may be implemented as hardware, software, a combination of hardware and software, or other implementations.

The circuit 100 is shown coupled via one or more external interfaces 110 to the circuit 92. According to various embodiments, external interfaces 110 are one or more of: a serial advanced technology attachment (e.g., SATA) interface; a serial attached small computer system interface (e.g., serial SCSI or SAS interface); a peripheral component interconnect express (e.g., PCIe) interface; a Fibre Channel interface; an Ethernet Interface (such as 10 Gigabit Ethernet); a nonstandard version of any of the preceding interfaces; a custom interface; or any other type of interface used to interconnect storage and/or communications and/or computing devices. For example, in some embodiments, the circuit 100 includes an SATA interface and a PCIe interface.

The circuit 100 is further shown coupled via one or more device interfaces 190 to circuit 94, which includes one or more storage devices, such as nonvolatile memory devices 192. According 20, to various embodiments, the device interfaces 190 are one or more of: an asynchronous interface; a synchronous interface; a double data rate (e.g., DDR) synchronous interface; an ONFI (e.g., open NAND flash interface) compatible interface, such as an ONFI 2.2 compatible interface; a toggle-mode compatible nonvolatile memory interface; a nonstandard version of any of the preceding interfaces; a custom interface; or any other type of interface used to connect to storage devices.

The nonvolatile memory devices 192 have, in some embodiments, one or more individual nonvolatile memory die 194. According to a type of a particular one of the nonvolatile memory devices 192, a plurality of nonvolatile memory die 194 in the particular nonvolatile memory device 192 are optionally and/or selectively accessible in parallel. The nonvolatile memory devices 192 are generally representative of one type of storage device enabled to communicatively couple to the circuit 100.

The circuit 100 may have one or more circuits, such as a host interface circuit 111, a data processing circuit 121, a buffer 131, a map 141, an error-correcting code (e.g., ECC) circuit 161, a central processing unit (e.g., CPU) 171, and device interface logic 191. The specific circuits and interconnections illustrated in FIG. 2 are merely representative of one embodiment, and many arrangements and interconnections of some or all of the circuits, as well as additional circuits not illustrated, may be implemented to meet the design criteria of a particular implementation.

The host interface 111 sends and receives commands and/or data via the external interface 110, and, in some embodiments, tracks progress of individual commands. For example, the commands include a read command specifying an address, such as a logical block address (e.g., LBA), and an amount of data, such as a number of logical block address quanta (e.g., sectors), to read; in response, the circuit 102 provides read status and/or read data. For another example, the commands include a write command specifying an address (such as a logical block address) and an amount of data (such as a number of logical block address quanta, e.g., sectors) to write; in response, the circuit 102 provides write status and/or requests write data and optionally subsequently provides write status. In some embodiments, the host interface 111 is compatible with an SATA protocol.

According to various embodiments, one or more of: data processing circuit 121 optionally and/or selectively processes some or all of the data sent between the buffer 131 and the external interfaces 110; and the data processing circuit 121 optionally and/or selectively processes data stored in the buffer 131. In some embodiments, the data processing circuit 121 performs one or more of: encrypting; decrypting; compressing; decompressing; formatting; reformatting; transcoding; and/or any other data processing and/or manipulation task.

The buffer 131 stores data sent to/from the external interfaces 110 from/to the device interfaces 190. In some embodiments, the buffer 131 additionally stores system data, such as some or all map tables and/or journal entries, used by the circuit 100 to manage the nonvolatile memory devices 192. In various embodiments, the buffer 131 has one or more of: a memory 137 used for temporary storage of data; a direct memory access (e.g., DMA) circuits 133 used to control movement of data to and/or from the buffer 131; an ECC-X circuit 135 used to provide a higher-level error correction function; and other data movement and/or manipulation functions. In some embodiments, the circuit 96 may be an extension of the buffer 131 and is used in conjunction with the map 141.

According to various embodiments, one or more of: the ECC circuit 161 optionally and/or selectively processes some or all of the data sent between the buffer 131 and the device interfaces 190; and the ECC circuit 161 optionally and/or selectively processes data stored in the buffer 131. In some embodiments, the ECC circuit 161 implements one or more of: a cyclic redundancy check (e.g., CRC) code; a Hamming code; a Reed-Solomon (e.g., RS) code; a Bose Chaudhuri Hocquenghem (e.g., BCH) code; a low-density parity check (e.g., LDPC) code; a Viterbi code; a trellis code; a hard-decision code; a soft-decision code; an erasure-based code; any error detecting and/or correcting code; and any combination of the preceding.

The device interface logic 191 controls the nonvolatile memory devices 192 via the device interfaces 190 and controls the circuit 96. The device interface logic 191 is enabled to send data to/from the nonvolatile memory devices 192 according to a protocol of the nonvolatile memory devices 192. The device interface logic 191 is further enabled to send data to/from the circuit 96 according to a protocol of the circuit 96.

The map 141 converts between data addressing used on the external interfaces 110 and data addressing used on the device interfaces 190, using a table 143 to map external data addresses to locations in the nonvolatile memory 94. For example, in some embodiments, the map 141 converts logical block addresses used on the external interfaces 110 to block and/or page addresses targeting one or more nonvolatile memory die 194, via mapping provided by the table 143.

According to various embodiments, the table 143 is stored in one or more of: static random access memory (e.g., SRAM); dynamic random access memory (e.g., DRAM); nonvolatile memory (such as flash memory); cache memory; on-chip memory; off-chip memory; and any combination of the foregoing. In some embodiments, the buffer 131 includes some or all of the table 143. For example, buffer 131 contains a cache of a portion of the table 143. In another example, some or all of the table 143 is stored in the circuit 96.

The circuit 171 controls various portions of circuit 100. The circuit 171 includes a central processing unit core 172. The core 172 is, according to various embodiments, one or more single-core or multi-core processors. The individual processor cores in the core 172 are, in some embodiments, multithreaded. The core 172 includes instruction and/or data caches and/or memories. For example, the instruction memory contains instructions to enable the core 172 to execute software (sometimes called firmware) to control the circuit 100. In some embodiments, some or all of the firmware executed by the core 172 is stored on the nonvolatile memory devices 192. The device management circuit 181 may be implemented as part of the circuit 171, or could be implemented in hardware, or could be implemented by a combination of firmware running on the circuit 171 and hardware.

Figure 3:
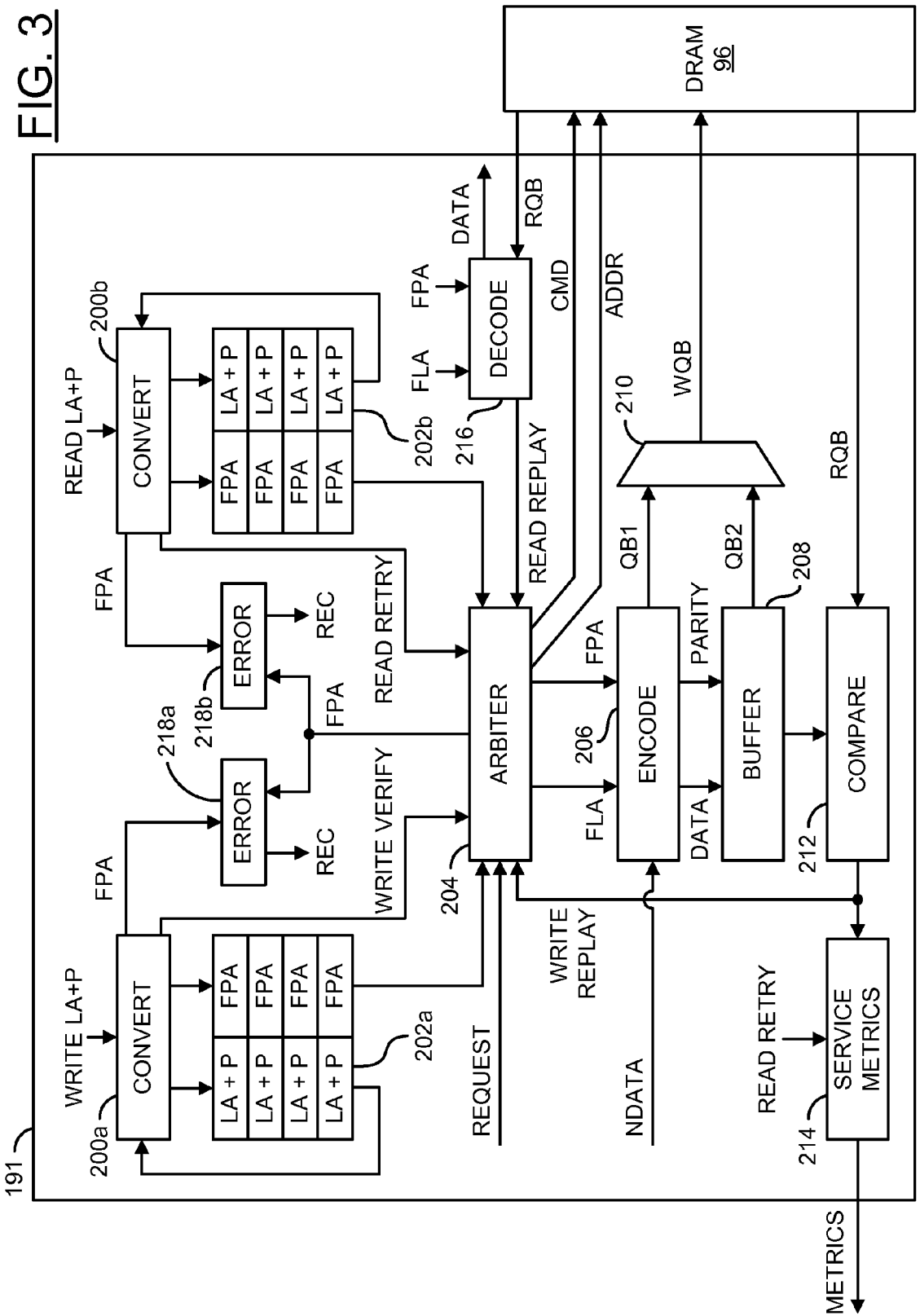
FIG. 3 is a functional flow diagram of example operations of device interface logic in accordance with an embodiment of the invention.

Referring to FIG. 3, a functional flow diagram of example operations of the circuit 191 is shown in accordance with an embodiment of the invention. The circuit 191 generally comprises multiple blocks (or functions) 200a-200b, multiple blocks (or functions) 202a-202b, a block (or function) 204, a block (or function) 206, a block (or function) 208, a block (or function) 210, a block (or function) 212, a block (or function) 214, a block (or function) 216 and multiple blocks (or functions) 218a-218b. The blocks 200a to 218b may represent modules and/or circuits that may be implemented as hardware, software, a combination of hardware and software, or other implementations. The functions performed provide reliability, availability and/or serviceability for data stored in the circuit 96.

Each block 200a-200b is shown implemented as a conversion block. The blocks 200a-200b are operational to convert logical addresses with parity (e.g., LA+P) into physical addresses. The logical addresses are usually generated internal to the circuit 100 (e.g., by the circuit 171). An initial (or first) physical address (e.g., FPA) in each quantum burst associated with the logical addresses is also identified. The conversion is implemented as a division. The circuit 96 may include an integer multiple number of regions that are a given power of two in size (e.g., 64 bytes). The user data (or a logical unit of data) received from the circuit 171 has another size (e.g., 56 bytes or 60 bytes). The remainder of the space in each region is used to store verification information (e.g., cyclical redundancy check values) and correction information (e.g., error correction codes). Conversion of a logical address (e.g., LA) to a physical address (e.g., PA) maps the 56 or 60 bytes (e.g., non-power of two numbers) of user data into the 64-byte regions (e.g., a specified power of two number). A first physical address based on a 56-byte logical unit of data is calculated per formula 1 as follows:

$$\text{FPA} = \text{floor}(\text{LA}/56) \times 64 \qquad (1)$$

A first logical address (e.g., FLA) is calculated per formula 2 as follows:

$$\text{FLA} = \text{floor}(\text{LA}/56) \times 56 \qquad (2)$$

A remainder (e.g., R) is calculated per formula 3 as follows:

$$R = \text{LA} - \text{FLA} \qquad (3)$$

A physical address (e.g., PA) is calculated per formula 4 as follows:

$$\text{PA} = \text{FPA} + R \qquad (4)$$

The value of LA/56 may be treated as an index. If the logical address LA is not divisible by 56, a value of LA modulo 56 is an "offset" of a start address of the data within a 56-byte memory region. If the length of data being written is not a multiple of 56 bytes or if the logical address LA is not divisible by 56, the data being written is misaligned at one end or the other (or both) and so a read-modify-write is used for any misaligned portions. A predetermined number of bytes (e.g., between 1 and 56 bytes) of the data are written in the circuit 96 in a region accessible according to the index (e.g., LA/56). A similar analysis can be made for a 60-byte logical unit of data (e.g., replace 56 with 60).

Table I illustrates an example quantum burst with 56 bytes of data (e.g., D0-D55). A logical address 0x00 (00 hexadecimal) is shown as the first logical address of the logical unit. A physical address 0x00 is shown as the first physical address of the physical unit.

TABLE I

| LA | Data Bytes | PA |
|---|---|---|
| 0x00 | D0-D7 | 0x00 |
| 0x08 | D8-D15 | 0x08 |
| 0x10 | D16-D23 | 0x10 |
| 0x18 | D24-D31 | 0x18 |
| 0x20 | D32-D39 | 0x20 |
| 0x28 | D40-D47 | 0x28 |
| 0x30 | D48-D55 | 0x30 |
|  | CRC/ECC | 0x38 |

Table II illustrates an example quantum burst with 60 bytes of data (e.g., D60-D119). A logical address 0x3C (3C hexadecimal) is shown as the first logical address of the logical unit. A physical address 0x40 is shown as the first physical address of the physical unit.

TABLE II

| LA | Data Bytes | PA |
|---|---|---|
| 0x3C | D60-D67 | 0x40 |
| 0x44 | D68-D75 | 0x48 |
| 0x4C | D76-D83 | 0x50 |
| 0x54 | D84-D91 | 0x58 |
| 0x5C | D92-D99 | 0x60 |
| 0x64 | D100-D107 | 0x68 |
| 0x6C | D108-D115 | 0x70 |
| 0x74 | D116-D119 | 0X78 |
| | CRC/ECC | 0x7C |

Each block 202a-202b is shown implemented as a first-in-first-out queue. The blocks 202a-202b are operational to store the logical addresses with parity information and the first physical addresses of each quantum burst waiting to be serviced.

The block 204 is shown implemented as an arbitration block. The circuit 204 is operational to arbitrate among the write requests (or operations) and the read requests (or operations) are stored in the queues 202a-202b in response to the signal REQUEST. The block 204 may also be operational to generate commands in a signal (e.g., CMD) and an address signal (e.g., ADDR) that are presented to the circuit 96. The signals CMD and ADDR may be components of the signal MEM.

The block 206 is shown implemented as an encoder block (e.g., the circuit 161). The block 206 is operational to generate a quantum burst package in a signal (e.g., QB1) by encoding the new data received in a signal (e.g., NDATA) for a corresponding write request in the queue 202a grated access to the circuit 96. The encoding generally includes calculating cyclical redundancy check values and calculating error correction code values. The block 206 is further operational to parse quantum bursts into data and parity information (e.g., error correction information and verification information).

The block 208 is shown implemented as a buffer block. The block 208 is operational to temporarily store the data and parity information generated by the block 106. The buffered data and parity information is available in a signal (e.g., QB2) generated by the block 208.

The block 210 is shown implemented as a multiplexer block. The block 210 is operational to multiplex (or route) either the quantum burst generated directly by the block 206 or the quantum burst stored in the block 208 into a quantum burst (or physical unit) carried by a signal WQB.

The block 212 is shown implemented as a comparison block. The block 212 is operational to compare some or all of a quantum burst buffered by the block 208 with a quantum block read from the circuit 96 and received in a signal (e.g., RQB).

The block 214 is shown implemented as a service metrics block. The block 214 is operational to gather statistics on the number of read retries and the number of write replays. The metrics are presented, such as by reporting to the circuit 171 and/or by sending a message to the circuit 92 in the signal METRICS.

The block 216 is shown implemented as a decode block. The block 216 is operational to decode quantum blocks read from the circuit 96 and received in the signal RQB. Successfully decoded data is presented in a signal (e.g., DATA). If the decoding is unsuccessful, a read retry request is generated.

The blocks 218a-218b are shown implemented as error detection blocks. Each block 218a-218b is operational to compare the first physical address of the current read or write request to a recalculated first physical address from the blocks 200a-200b, respectfully. If the compared first physical addresses match, the current write replay or read retry continue. Otherwise, an error is reported, such as by reporting the error to the circuit 171 and/or by sending a recovery message to the circuit 92 in the signal REC.

Figure 4A:
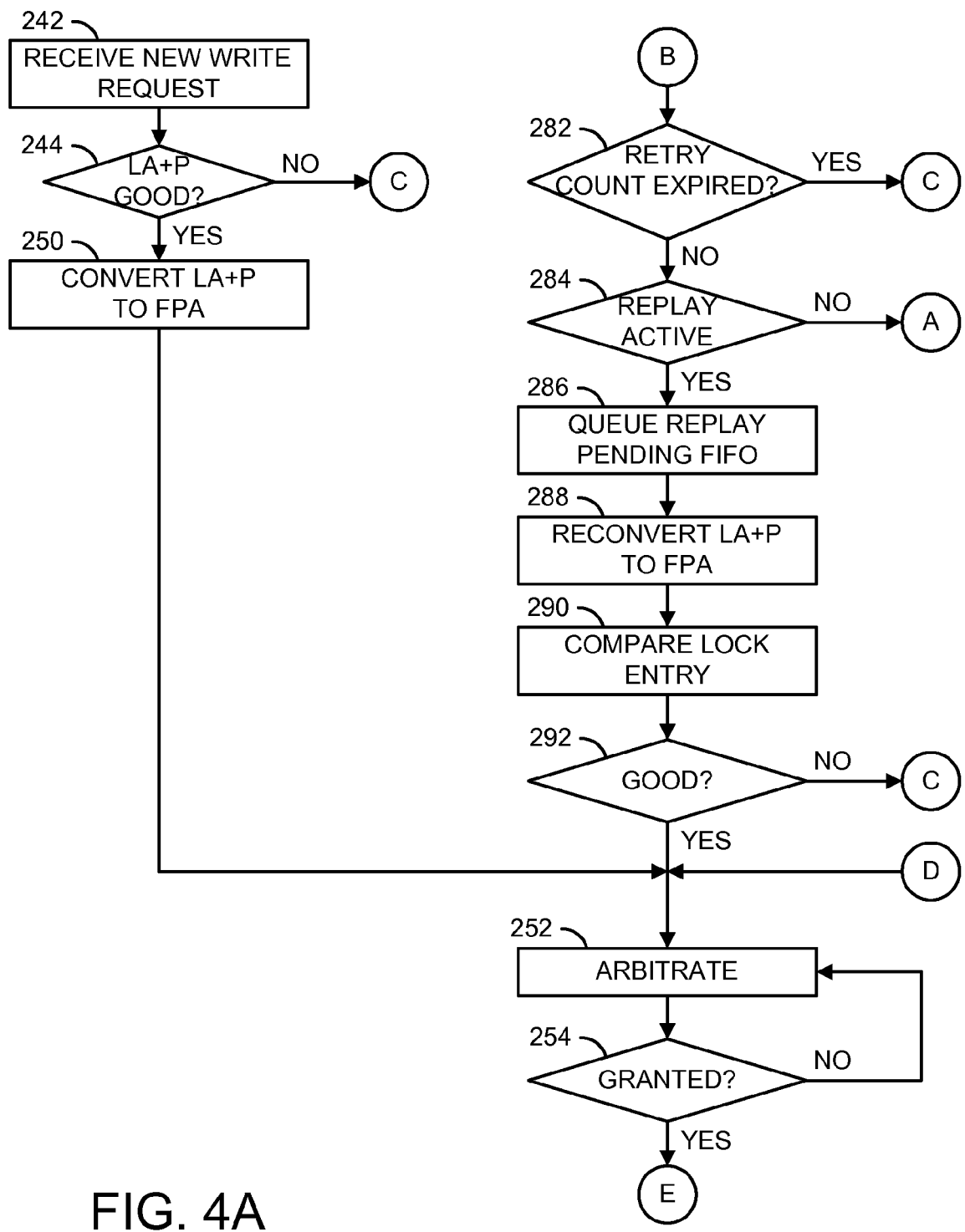
FIGS. 4A-4C are a flow diagram of a write operation.
Figure 4B:
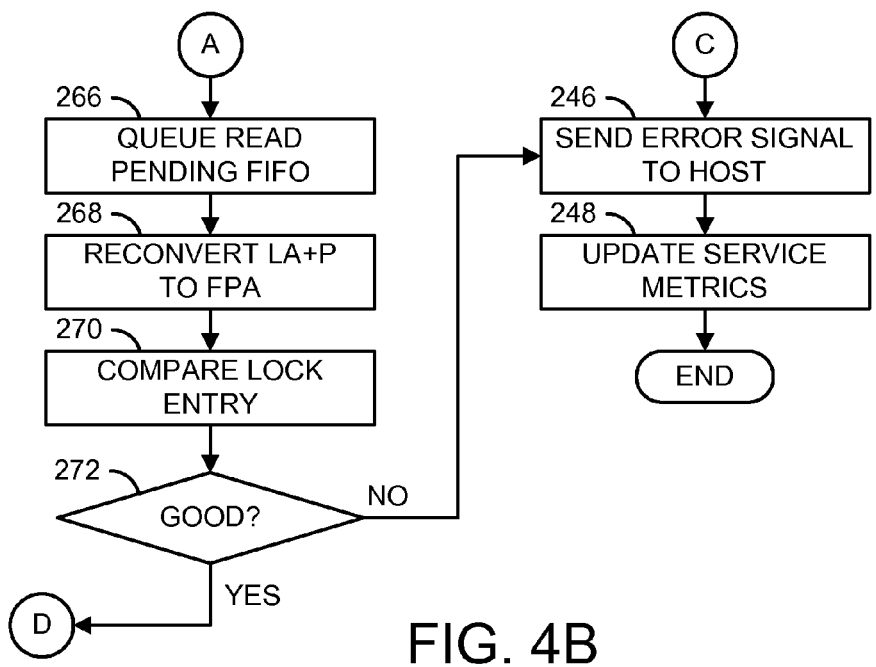
Figure 4C:
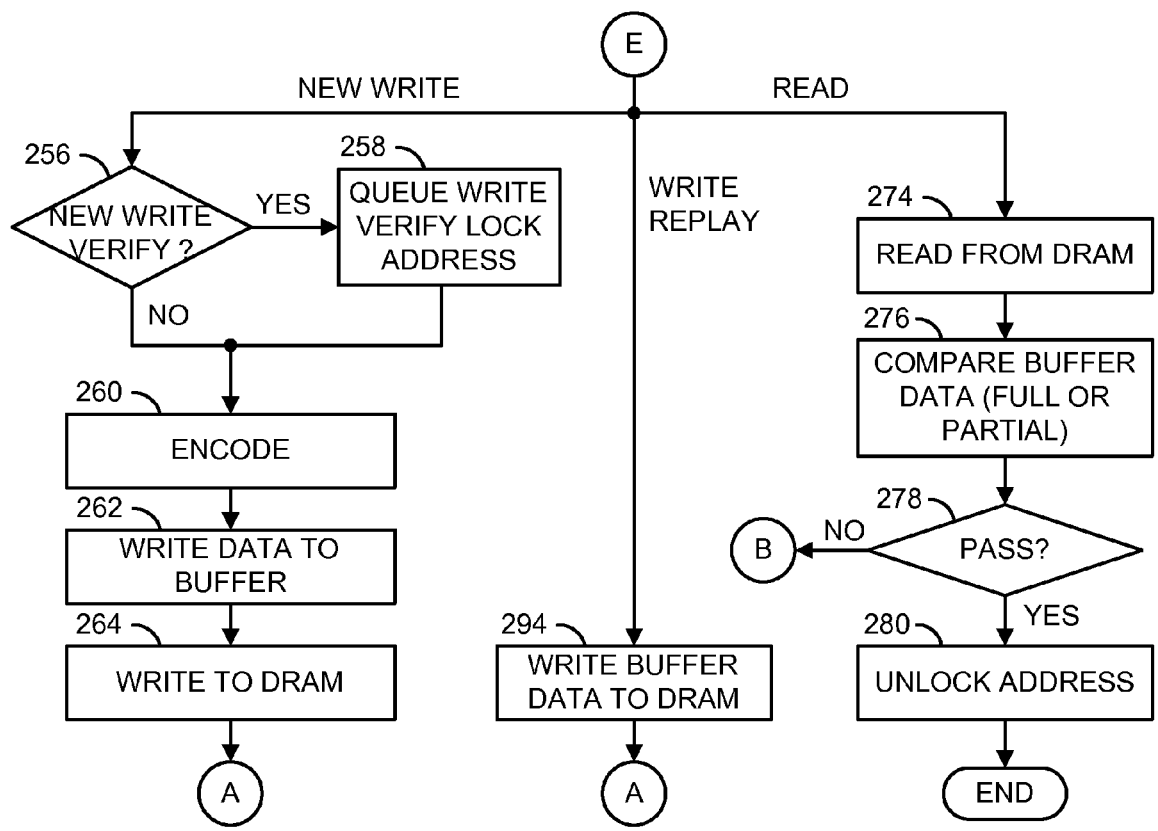

Referring to FIGS. 4A-4C, a flow diagram of an example implementation of a method 240 for a write operation is shown. The method (or process) 240 is shown implemented in the circuit 100. The method 240 generally comprises a step (or state) 242, a step (or state) 244, a step (or state) 246, a step (or state) 248, a step (or state) 250, a step (or state) 252, a step (or state) 254, a step (or state) 256, a step (or state) 258, a step (or state) 260, a step (or state) 262, a step (or state) 264, a step (or state) 266, a step (or state) 268, a step (or state) 270, a step (or state) 272, a step (or state) 274, a step (or state) 276, a step (or state) 278, a step (or state) 280, a step (or state) 282, a step (or state) 284, a step (or state) 286, a step (or state) 288, a step (or state) 290, a step (or state) 292 and a step (or state) 294. The steps 242 to 294 may represent modules and/or blocks that may be implemented as hardware, software, a combination of hardware and software, or other implementations. The sequence of the steps is shown as a representative example. Other step orders may be implemented to meet the criteria of a particular application.

In the step 242, a new write request is received in the signal REQUEST. The parity of a logical address corresponding to the new write request is checked in the step 244. If an error is discovered in the logical address, an error signal is sent to the circuit 92 and/or the circuit 171 in the step 246. The service metrics are updated accordingly in the step 248 by the block 214 and the method 240 is ended. If the logical address is good, the block 200a converts the logical address into a physical address in the step 250 and the first physical address of the associated quantum burst is identified.

In the step 252, the block 204 performs an arbitration among the pending write requests and pending read requests stored in the queue blocks 202a-202b. Consider a current write request that is granted access to the circuit 96 in the step 254. For a new write request, a check is performed in the step 256 to determine if the write request is a new write with verify request. If the request is a write with verify request, the write with verify request is entered into the queue 202a and the address is locked in the step 258. Once the address is locked, or if the request is not a new write with verify request, the new data in a logical unit associated with the current write request is encoded in the step 260 by the block 206. The encoding may be based on either or both the first physical address of the new quantum burst and a first logical address associated with the new quantum burst.

In the step 264, the quantum burst is multiplexed through the block 210 from the signal QB1 to the signal WQB and written into the circuit 96. In addition to the write operation to the circuit 96, the new quantum burst (both the data and the parity information) is buffered in the block 208 in the step 262.

In the step 266, a read request for the just-written quantum burst is added to the queue 202b. The block 200b reconverts the logical address into a physical address in the step 268 and the first physical address of the associated quantum burst is identified. The reconverted first physical address is compared with the locked first physical address in the step 270 by the block 212. If the two first physical addresses do not match per the step 272, an error signal is sent to the circuit 92 and the service metrics are updated in the steps 246 and 248, respectively.

If the reconverted first physical address and the locked first physical address match per the step 272, the queued read request is arbitrated by the block 204 in the step 252. Once the arbitration grants access to read from the circuit 96, all or a portion (or subset) of the just-written quantum burst is read from the circuit 96 in the signal RQB per the step 274.

The entire/portion of the quantum burst as read from the circuit 96 is compared with the corresponding entire/portion of the quantum burst buffered in the block 208 in the step 276. The write with verify method ensures that each quantum burst written to the circuit 96 is verified before allowing new requests to access the data. A user has an option to pattern match all bits in the quantum bursts or just the data protection information (e.g., the error correction information and/or the verification information).

If the comparison succeeds per the step 278, the locked first physical address is unlocked in the step 280. If the comparison fails (or is unsuccessful) per the step 278, the write request is replayed and the data is re-written to the circuit 96. The partial comparison option preserves interface bandwidth because only a small number (e.g., 8) of bytes of the quantum burst (e.g., 64 bytes) are read. The coherency of the locked address is checked during the verification operation to ensure that new requests to the arbiter block 204 for the same quantum burst have been blocked and the address generation is consistent with prior results.

To replay the write request (e.g., re-write), a check is performed in the step 282 to determine if a retry count has expired. If the retry count has expired, an error message is sent to the computer 92 and the service metrics are updated in the steps 246 and 248, respectively. Where the retry count has not expired, another check is made in the step 284 to determine if the replay is active. If the replay is not active, another read request is queued in the step 266 and the read is retried by the steps 268 to 278.

If the replay is active per the step 284, a replay request is queued in the block 202a in the step 286. The current logical address is reconverted into another first physical address in the step 288 by the block 200a. A comparison of the original first physical address and the reconverted first physical address is performed in the step 290 by the block 218a. If the comparison shows an error per the step 292, the error message is sent and the service metrics are updated in the steps 246 and 248, respectively. If the comparison shows a match between the two first physical addresses per the step 292, the replay request is arbitrated in the step 252. Once access to the circuit 96 is granted in the step 254 for the write replay, the quantum burst held in the block 208 is presented to the block 210 in the signal QB2. The quantum burst is multiplexed to the signal WQB and written into the circuit 96 in the step 294. A read request for the rewritten quantum burst is queued in the step 266. The write verification is subsequently performed in the steps 268 to 278. The write replay may be repeated until a terminal count is reached per the step 282.

Figure 5:
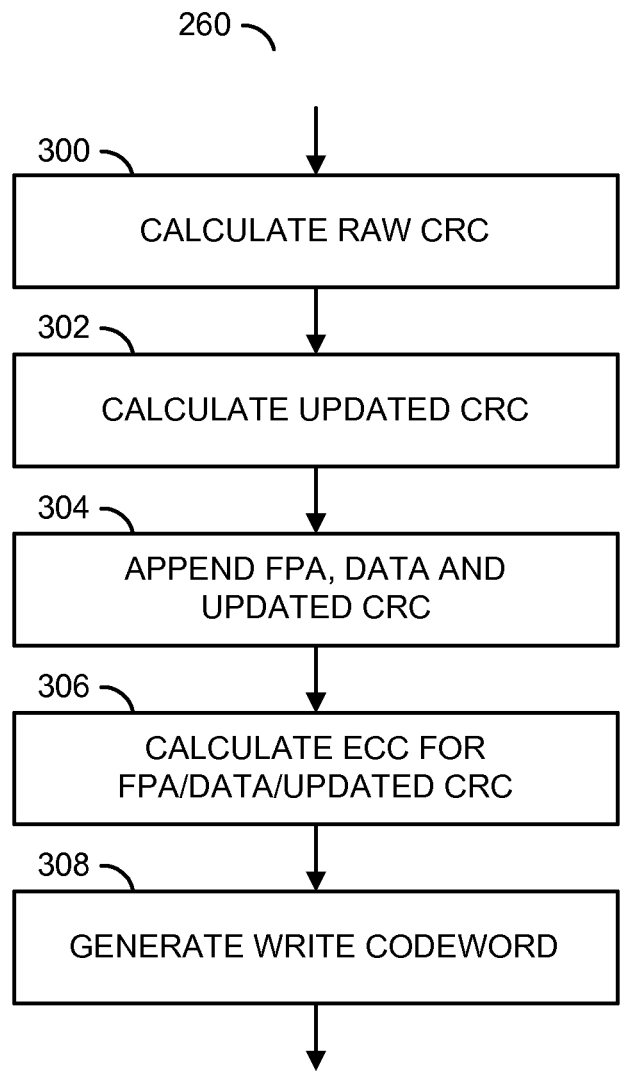
FIG. 5 is a flow diagram of an encode operation.

Referring to FIG. 5, a detailed flow diagram of the encode step 260 is shown. The step 260 generally comprises a step (state) 300, a step (or state) 302, a step (or state) 304, a step (or state) 306 and a step (or state) 308. The steps 300 to 308 may represent modules and/or blocks that may be implemented as hardware, software, a combination of hardware and software, or other implementations. The sequence of the steps is shown as a representative example. Other step orders may be implemented to meet the criteria of a particular application.

In the step 300, a raw cyclical redundancy check value is calculated from the new data by the block 206. An updated (or modified) cyclical redundancy check value is calculated in the step 302 based on (i) the raw cyclical redundancy check value and (ii) the first logical address and/or the first physical address. For example, in some embodiments the updated cyclical redundancy check value may be calculated by a logical exclusive OR of the raw cyclical redundancy check value and the first logical address. In other embodiments, the first logical address may be folded and the update cyclical redundancy check value is an exclusive OR of the raw cyclical redundancy check value and half the first logical address bits (e.g., FLA [31:16]) and an exclusive OR with the other half the first logical address bits (e.g., FLA [15:0]). In still other embodiments, the first logical address is processed by the raw cyclical redundancy check as if further bytes of the new data.

In the step 304, an intermediate block is created by appending the first physical address with the new data and the updated cyclical redundancy check value (e.g., [FPA0, FPA1, FPA2, FPA3, D0, D1, ..., D54, D55, CRC0, CRC1, CRC2, CRC3]). Error correction code (e.g., ECC) syndrome bytes are calculated in the step 306 over the intermediate block and optionally include the first physical address as a part of the data being encoded. In some embodiments, the error correction codes may be calculated per the Reed-Solomon coding. Other encoding techniques may be implemented to meet the criteria of a particular application. In the step 308, the encoded quantum burst is created by appending the new data with the cyclical redundancy check and the error correction codes (e.g., [D0, D1, ..., D54, D55, CRC0, CRC1, CRC2, CRC3, ECC0, ECC1, ECC2, ECC3] for 56 bytes of data or [D0, D1, ..., D58, D59, CRC0, CRC1, ECC0, ECC1] for 60 bytes of data). Returning to FIG. 4C, the quantum burst is written into the circuit 96 in the step 264 and into the block 208 in the step 262.

Figure 6A:
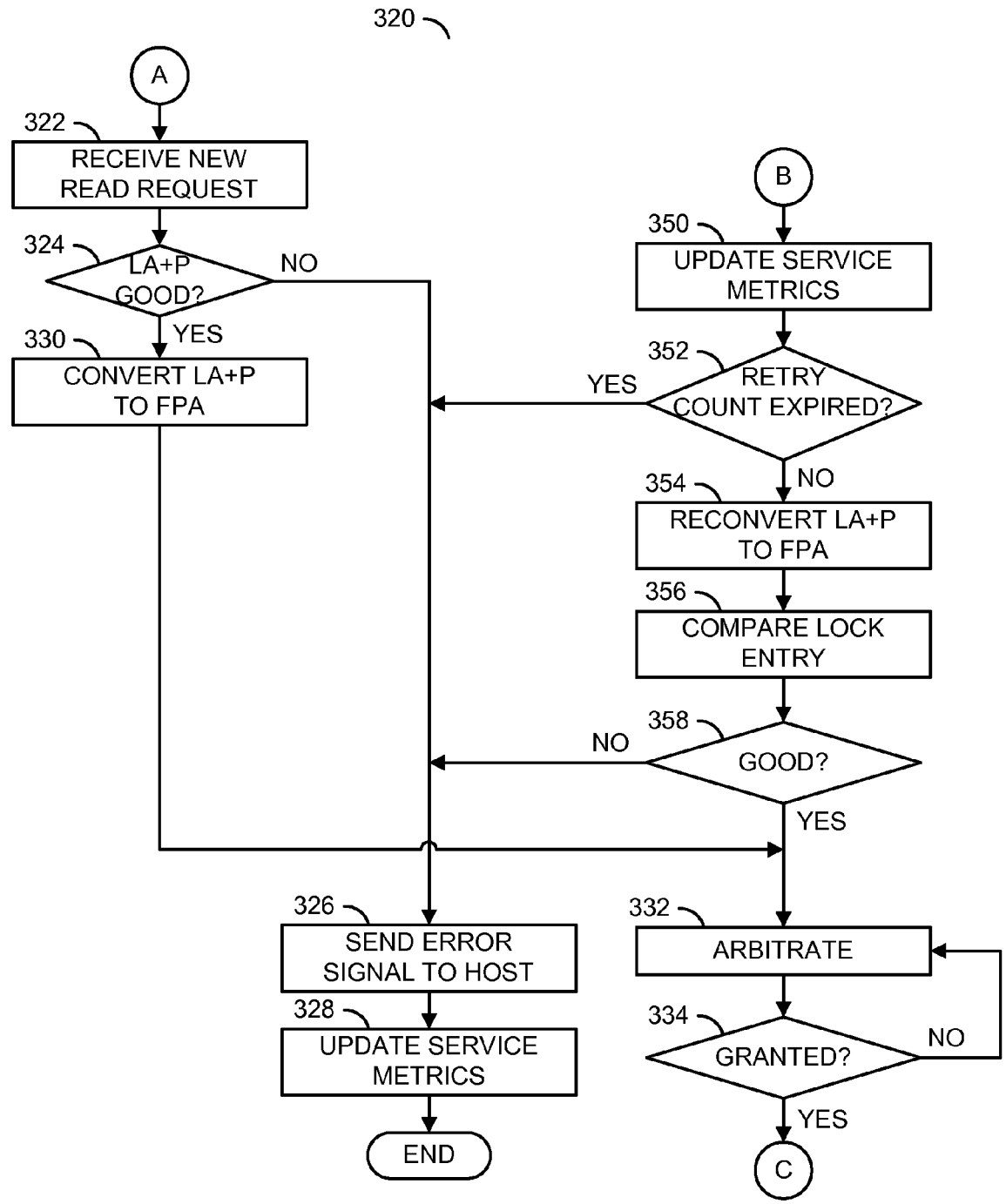
FIGS. 6A-6B are a flow diagram of a read operation.
Figure 6B:
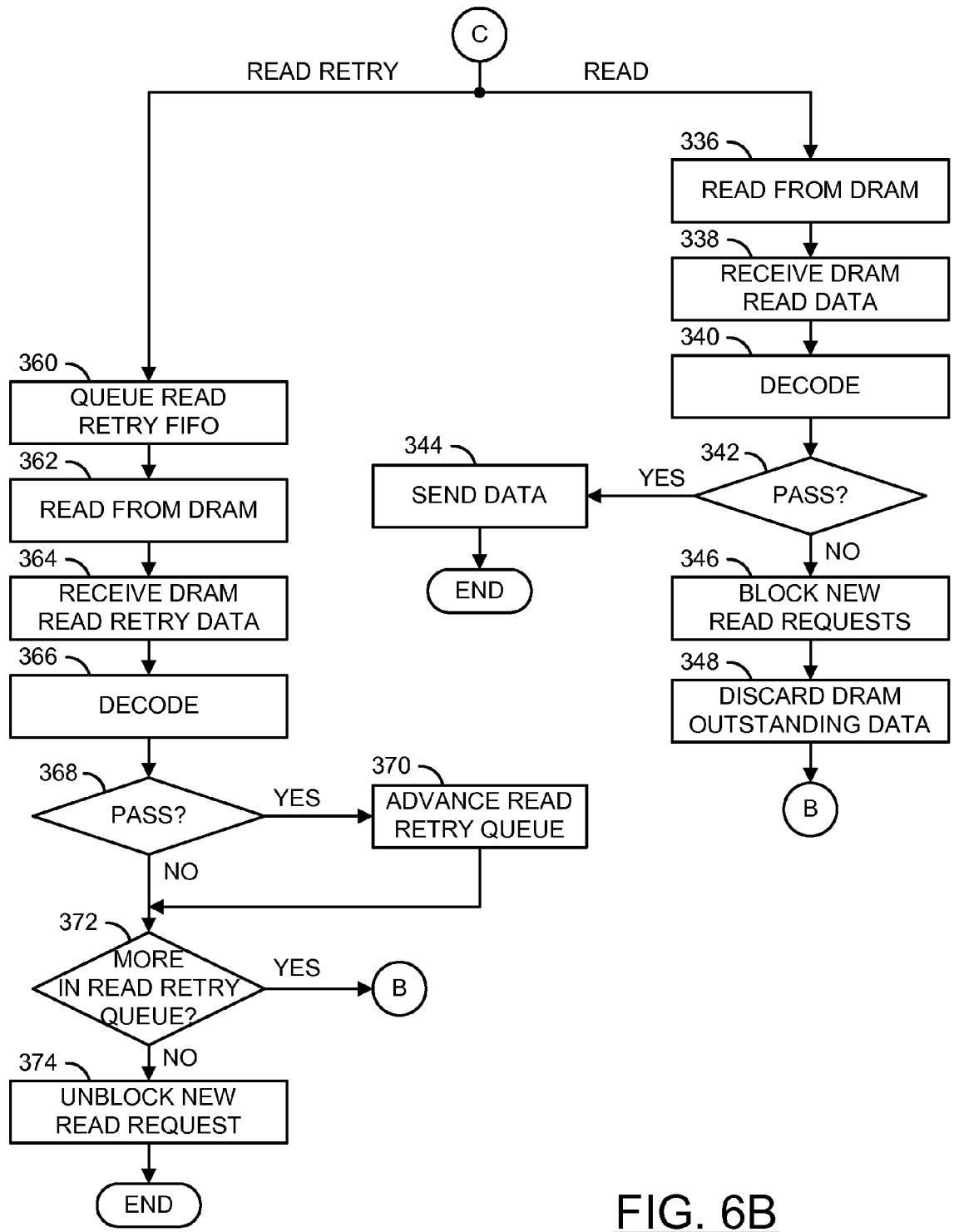

Referring to FIGS. 6A-6B, a flow diagram of an example implementation of method 320 for a read operation is shown. The method (or process) 320 is shown implemented in the circuit 100. The method 320 generally comprises a step (or state) 322, a step (or state) 324, a step (or state) 326, a step (or state) 328, a step (or state) 330, a step (or state) 332, a step (or state) 334, a step (or state) 336, a step (or state) 338, a step (or state) 340, a step (or state) 342, a step (or state) 344, a step (or state) 346, a step (or state) 348, a step (or state) 350, a step (or state) 352, a step (or state) 354, a step (or state) 356, step (or state) 358, a step (or state) 360, a step (or state) 362, a step (or state) 364, a step (or state) 366, a step (or state) 368, a step (or state) 370, a step (or state) 372 and a step (or state) 374. The steps 322 to 374 may represent modules and/or blocks that may be implemented as hardware, software, a combination of hardware and software, or other implementations. The sequence of the steps is shown as a representative example. Other step orders may be implemented to meet the criteria of a particular application.

In the step 322, a new read request is received in the signal REQUEST. The parity of a logical address corresponding to the new read request is checked in the step 324. If an error is discovered in the logical address, an error signal is sent to the circuit 92 in the step 326. The service metrics are updated accordingly in the step 328 by the block 214 and the method 320 is ended. If the logical address is good, the block 200b converts the logical address into a physical address in the step 330 and the first physical address of the associated quantum burst is identified.

In the step 332, the block 204 performs an arbitration among the pending read requests and pending write requests stored in the queue blocks 202a-202b. Consider a current read request that is granted access to the circuit 96 in the step 324. In the step 326, the quantum burst data at the associated first physical address is read from the circuit 96. After a read delay, the read quantum burst is received by the circuit 100 in the step 338. The quantum burst is decoded in the block 216 per the step 330. The decoding utilizes the first logical address and the first physical address in an attempt to recover from any errors that may have occurred internally to the circuit 96 and/or on the interface between the circuits 96 and 100. If the decoding reaches a successful completion per the step 342, the decoded data is presented internally to the circuit 100 (e.g., to the circuit 171) in the step 344.

If the decoding reaches an unsuccessful completion per the step 342, new read requests are blocked in the step 346. In the step 348, outstanding data read requests in the circuit 202b are discarded and a read retry (or re-read) is initiated. The read retry method ensures that data is provided in a timely manner despite transient catastrophic events on the interface. The address for the data is locked to access operations to the same quantum burst until the read request passes an error correction code check. If the data cannot be recovered, new read operations are blocked and the outstanding read command queue in the block 202b is replayed to try again. The coherency of the locked address is checked during the retry to verify that new requests to the arbiter for the same quantum burst have been blocked and the address generation is consistent with prior results.

To replay the read request (e.g., re-read), the service metrics are updated by the block 214 in the step 350. A check is performed in the step 352 to determine if a retry count has expired. If the retry count has expired, an error message is sent to the computer 92 and the service metrics are updated in the steps 326 and 328, respectively. Where the retry count has not expired, the current logical address is reconverted into another first physical address in the step 354 by the block 200b. A comparison of the original first physical address and the reconverted first physical address is performed in the step 356 by the block 218b. If the comparison shows and error per the step 358, the block 218b sends an error message to the circuit 92 and the service metrics are updated in the step 326 and 328, respectively.

If the comparison shows a match between the two first physical address per the step 358, the retry request is arbitrated in the step 332 by the block 204. When the read retry is granted access to the circuit 96 per the step 334, the read retry is queued in a read retry FIFO in the step 362. The quantum block is read again from the circuit 96 in the step 362 and eventually received by the circuit 100 in the step 364. The read replay can be repeated until a terminal count is reached per the step 352.

The just-read quantum burst is decoded by the block 216 in the step 366. A check is performed in the step 368 to determine if the decoding was successful or not. If the decoding was successful, the decoded data is sent to the requesting processor (e.g., the circuit 171) and the read retry queue is advanced in the step 370. Thereafter, or if the decoding was not successful, another check is performed in the step 372 to determine if more read retries are still in the queue. If more read retries remain in the read retry queue, the method 320 resumes with the step 350 to update the service metrics. Once the read retry queue is empty per the step 372, new read requests are unblocked in the step 374. The write verify replay and read retry metrics are tracked to detect problems (e.g., power droop, clock jitter or signal integrity) in the sub-system containing the circuit 96.

Figure 7:
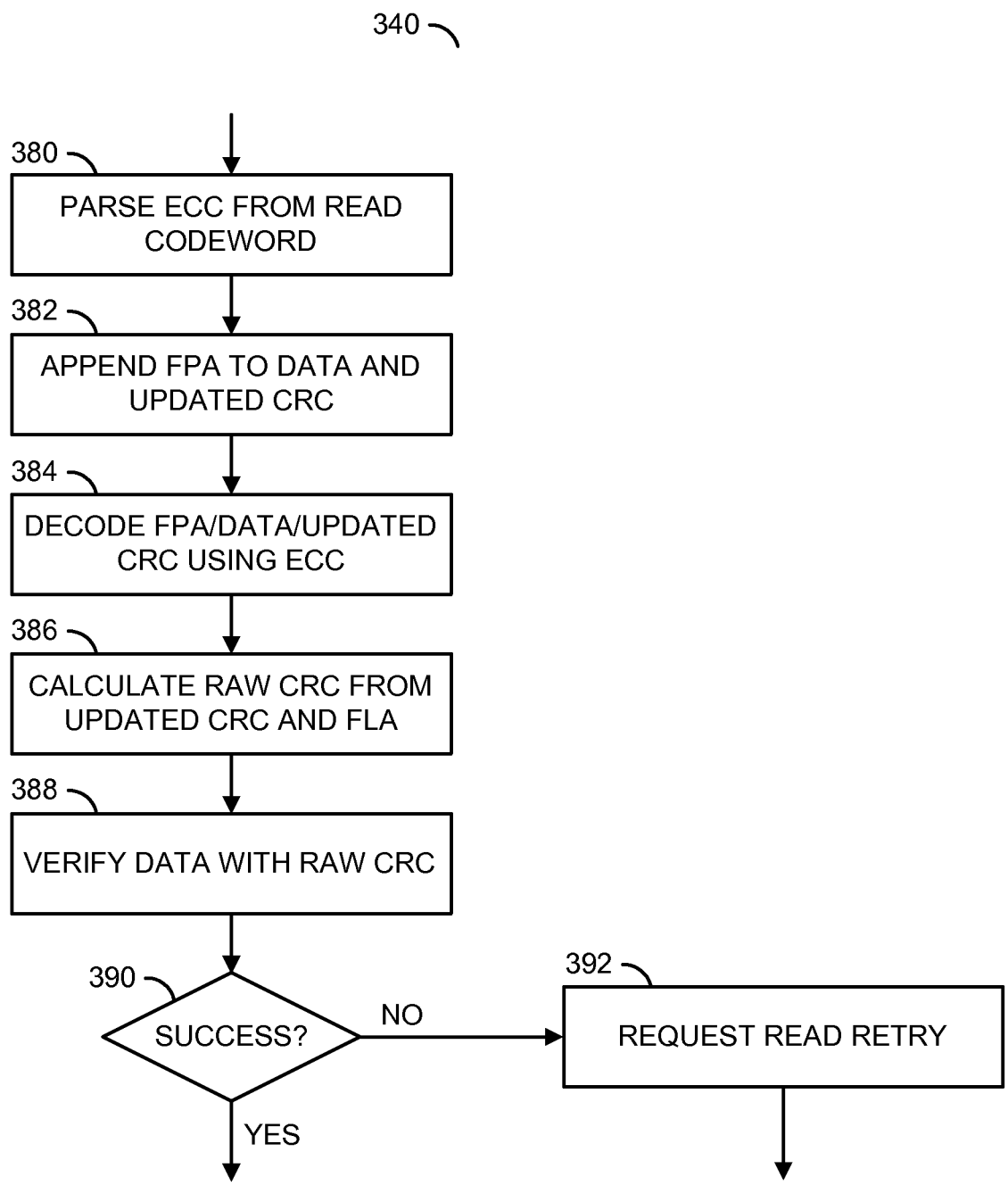
FIG. 7 is a flow diagram of a decode operation.

Referring to FIG. 7, a detailed flow diagram of the decode step 340 is shown. The step 340 generally comprises a step (state) 380, a step (or state) 382, a step (or state) 384, a step (or state) 386, a step (or state) 388, a step (or state) 390 and a step (or state) 392. The steps 380 to 392 may represent modules and/or blocks that may be implemented as hardware, software, a combination of hardware and software, or other implementations. The sequence of the steps is shown as a representative example. Other step orders may be implemented to meet the criteria of a particular application.

In the step 380, the error correction code bytes are parsed from the just-read quantum burst codeword by the block 216. The first physical address is optionally appended to the data and the updated cyclical redundancy check bytes in the step 382 to recreate the intermediate block via decoding in step 384. In the step 386, the intermediate block is decoded using the error correction codes. In some embodiments, the decoding may implement a Reed-Solomon decoding. Other decoding techniques may be implemented to meet the criteria of a particular application.

In the step 386, the raw cyclical redundancy check values are calculated from (i) the updated cyclical redundancy check values and (ii) the first logical address and/or the first physical address. The step 386 is generally a reverse operation of the step 302 in FIG. 5. The data is verified using the raw cyclical redundancy checks in the step 388. If the decoding is successful per the step 390, the decoded data is presented in the signal DATA. If the decoding is unsuccessful, a read retry request is generated in the step 392.

Figure 8:
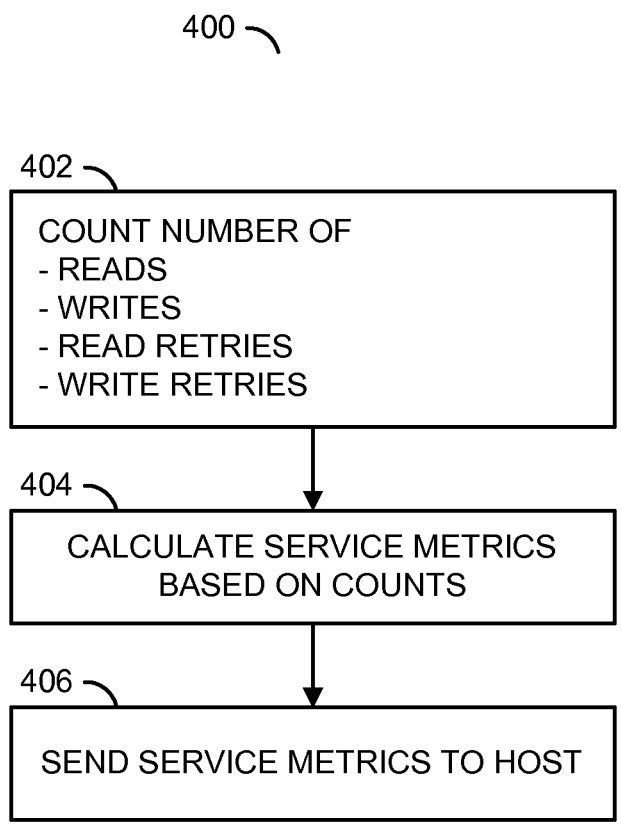
FIG. 8 is a flow diagram of a service metrics update operation.

Referring to FIG. 8, a flow diagram of an example implementation of a service metrics update method 400 is shown. The method (or process) 400 is implemented by the circuit 100. The method 400 generally comprises a step (or state) 402, a step (or state) 404 and a step (or state) 406. The steps 402 to 406 may represent modules and/or blocks that may be implemented as hardware, software, a combination of hardware and software, or other implementations. The sequence of the steps is shown as a representative example. Other step orders may be implemented to meet the criteria of a particular application.

In the step 402, the service metrics block 214 counts the number of read operations, write operations, read retries and write retries. The counts are used in the step 404 to calculate the updated service metrics values for the circuit 102. In the step 406, the updated service metrics are sent to the circuit 171 and/or the circuit 92 in the signal METRICS.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions performed by the diagrams of FIGS. 3-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to embodiments thereof, it will be understood by those skilled in the art that various changes in form and details may be made without departing from the scope of the invention.

The invention claimed is:

1. A method for protecting data in a memory, comprising the steps of:
converting a logical address of one of a plurality of logical units to a physical address of a particular one of a plurality of physical units, wherein (i) each of the physical units includes data from a corresponding one of the logical units, respective error correction information and respective verification information and (ii) the respective verification information of the particular physical unit includes an indication of the logical address that corresponds to the particular physical unit;
writing the particular physical unit into the memory;
reading a portion of the particular physical unit from the memory, wherein the portion includes the respective verification information; and
verifying if the particular physical unit was successfully written into the memory based on the respective verification information as read from the memory.

2. The method according to claim 1, further comprising the step of:
prohibiting one or more read operations from accessing the particular physical unit in the memory between the write of the particular physical unit and a successful verification of the particular physical unit.

3. The method according to claim 1, wherein the portion of the particular physical unit is less than all of the particular physical unit.

4. The method according to claim 1, wherein the portion of the particular physical unit is no more than the respective error correction information and the respective verification information.

5. The method according to claim 1, wherein the verification includes comparing the respective error correction information and the respective verification information as read from the memory with copies of the respective error correction information and the respective verification information saved in a buffer.

6. The method according to claim 1, further comprising the step of:
re-writing the particular physical unit to the memory in response to an unsuccessful verification.

7. The method according to claim 6, further comprising the step of:
storing a copy of the particular physical unit in a buffer, wherein the re-write uses the copy of the particular physical unit in the buffer.

8. The method according to claim 1, wherein the conversion of the logical address includes dividing the logical address by a non-power-of-two number that is less than a specified power of two to determine at least a part of the physical address.

9. The method according to claim 1, wherein the respective verification information is a cyclic redundancy check value based on both (i) the data from the corresponding logical unit and (ii) the logical address.

10. The method according to claim 1, wherein the respective error correction information is encoded with one of (i) the logical address and (ii) the physical address.

11. The method according to claim 1, further comprising the steps of:
reading the particular physical unit from the memory; and
correcting one or more errors encountered in the particular physical unit as read from the memory using the respective error correction information.

12. The method according to claim 11, further comprising the steps of:
re-reading the particular physical unit from the memory in response to the particular physical unit as read from the memory being uncorrectable; and
re-correcting the particular physical unit as re-read from the memory.

13. An apparatus comprising:
an interface configured to process a plurality of read/write operations to/from a memory; and a controller circuit connected to the interface and configured to (i) convert a logical address of one of a plurality of logical units to a physical address of a particular one of a plurality of physical units, wherein (a) each of the physical units includes data from a corresponding one of the logical units, respective error correction information and respective verification information and (b) the respective verification information of the particular physical unit includes an indication of the logical address that corresponds to the particular physical unit, (ii) write the particular physical unit into the memory, (iii) read a portion of the particular physical unit from the memory, wherein the portion includes the respective verification information and (iv) verify if the particular physical unit was successfully written into the memory based on the respective verification information as read from the memory.

14. The apparatus according to claim 13, wherein the controller circuit is further configured to prohibit one or more read operations from accessing the particular physical unit in the memory between the write of the particular physical unit and a successful verification of the particular physical unit.

15. The apparatus according to claim 13, wherein the portion of the particular physical unit is less than all of the particular physical unit.

16. The apparatus according to claim 13, wherein the portion of the particular physical unit is no more than the respective error correction information and the respective verification information.

17. The apparatus according to claim 13, wherein the verification includes a comparison of the respective error correction information and the respective verification information as read from the memory with copies of the respective error correction information and the respective verification information saved in a buffer.

18. The apparatus according to claim 13, wherein the controller circuit is further configured to re-write the particular physical unit to the memory in response to an unsuccessful verification.

19. An apparatus comprising:
 a memory configured to process a plurality of read/write operations; and
 a controller configured to (i) convert a logical address of one of a plurality of logical units to a physical address of a particular one of a plurality of physical units, wherein (a) each of the physical units includes data from a corresponding one of the logical units, respective error correction information and respective verification information and (b) the respective verification information of the particular physical unit includes an indication of the logical address that corresponds to the particular physical unit, (ii) write the particular physical unit into the memory, (iii) read a portion of the particular physical unit from the memory, wherein the portion includes the respective verification information, and (iv) verify if the particular physical unit was successfully written into the memory based on the respective verification information as read from the memory.

20. The apparatus according to claim 19, wherein the memory and the controller are part of a solid-state drive.

* * * * *